(12) United States Patent
Masuhara et al.

(10) Patent No.: US 9,997,378 B2
(45) Date of Patent: Jun. 12, 2018

(54) SUBSTRATE PROCESSING APPARATUS AND SUBSTRATE PROCESSING METHOD

(71) Applicant: SCREEN HOLDINGS CO., LTD., Kyoto-shi, Kyoto (JP)

(72) Inventors: Hirofumi Masuhara, Kyoto (JP); Kenichiro Arai, Kyoto (JP); Masahiro Miyagi, Kyoto (JP); Toru Endo, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 23 days.

(21) Appl. No.: 15/399,273

(22) Filed: Jan. 5, 2017

(65) Prior Publication Data

US 2017/0117163 A1 Apr. 27, 2017

Related U.S. Application Data

(62) Division of application No. 13/853,004, filed on Mar. 28, 2013, now Pat. No. 9,576,808.

(30) Foreign Application Priority Data

Mar. 28, 2012 (JP) ................................ 2012-073600

(51) Int. Cl.
*B44C 1/22* (2006.01)
*C03C 15/00* (2006.01)
(Continued)

(52) U.S. Cl.
CPC .......... *H01L 21/67023* (2013.01); *B08B 3/04* (2013.01); *H01L 21/02057* (2013.01);
(Continued)

(58) Field of Classification Search
None
See application file for complete search history.

(56) References Cited

U.S. PATENT DOCUMENTS 4,871,417 A 10/1989 Nishizawa et al.
5,678,116 A * 10/1997 Sugimoto ............. G03F 7/3021
396/611
(Continued)

FOREIGN PATENT DOCUMENTS

JP 63-211725 A 9/1988
JP 03-022428 B2 1/1991
(Continued)

OTHER PUBLICATIONS

Non-Final Office Action U.S. Appl. No. 13/853,004 dated Sep. 11, 2014.
(Continued)

*Primary Examiner* — Allan Olsen
(74) *Attorney, Agent, or Firm* — McDermott Will & Emery LLP

(57) ABSTRACT

In a substrate processing apparatus, with an internal space of a chamber brought into a pressurized atmosphere, an etching process is performed by continuously supplying a first processing liquid onto an upper surface of a substrate while rotating the substrate. It is thereby possible to suppress vaporization of the first processing liquid on the substrate and further suppress a decrease in the temperature of the substrate due to the heat of vaporization as it goes from a center portion of the substrate toward a peripheral portion thereof as compared with under normal pressure. As a result, it is possible to improve the uniformity in the temperature of the upper surface of the substrate during the etching process using the first processing liquid and improve the uniformity of etching over the entire upper surface of the substrate.

6 Claims, 3 Drawing Sheets

(51) Int. Cl.
*H01L 21/67* (2006.01)
*H01L 21/306* (2006.01)
*B08B 3/04* (2006.01)
*H01L 21/02* (2006.01)
*H01L 21/687* (2006.01)

(52) U.S. Cl.
CPC .... *H01L 21/30604* (2013.01); *H01L 21/6708* (2013.01); *H01L 21/67075* (2013.01); *H01L 21/67115* (2013.01); *H01L 21/68764* (2013.01)

(56) References Cited

U.S. PATENT DOCUMENTS

| | | | |
|---|---|---|---|
| 5,882,433 A * | 3/1999 | Ueno | H01L 21/67028 134/31 |
| 5,884,009 A | 3/1999 | Okase | |
| 6,516,816 B1 * | 2/2003 | Husain | H01L 21/67028 134/103.2 |
| 6,632,292 B1 * | 10/2003 | Aegerter | C23F 1/18 134/2 |
| 6,793,769 B2 | 9/2004 | Kajino et al. | |
| 7,018,555 B2 | 3/2006 | Shimbara et al. | |
| 7,357,842 B2 * | 4/2008 | Ishikawa | G03B 27/32 118/50 |
| 7,404,681 B1 * | 7/2008 | Cooper | H01L 21/6715 118/52 |
| 7,473,321 B2 | 1/2009 | Koga et al. | |
| 8,262,799 B2 | 9/2012 | Nishide | |
| 8,286,580 B2 | 10/2012 | Choi et al. | |
| 8,366,872 B2 * | 2/2013 | Tsutsumi | C23C 26/00 156/345.51 |
| 9,640,382 B2 * | 5/2017 | Masuhara | H01L 21/02282 |
| 2003/0201000 A1 * | 10/2003 | Worm | H01L 21/67051 134/32 |
| 2004/0071872 A1 * | 4/2004 | Kawase | H01L 21/6715 427/240 |
| 2004/0072450 A1 * | 4/2004 | Collins | G03F 7/162 438/782 |
| 2004/0084144 A1 | 5/2004 | Yokouchi et al. | |
| 2004/0154641 A1 | 8/2004 | Montierth | |
| 2005/0005957 A1 | 1/2005 | Yamagata et al. | |
| 2005/0106892 A1 * | 5/2005 | Oosaka | B81C 1/00047 438/745 |
| 2006/0088959 A1 * | 4/2006 | Gale | H01L 21/28167 438/142 |
| 2006/0112974 A1 * | 6/2006 | Isago | B01F 3/022 134/31 |
| 2006/0234508 A1 * | 10/2006 | Shirakashi | H01L 21/67173 438/691 |
| 2007/0131256 A1 | 6/2007 | Nanba et al. | |
| 2007/0241414 A1 * | 10/2007 | Narihiro | H01L 27/1203 257/401 |
| 2008/0006302 A1 * | 1/2008 | Araki | H01L 21/0206 134/26 |
| 2008/0073324 A1 * | 3/2008 | Nogami | H01L 21/02087 216/58 |
| 2008/0176002 A1 * | 7/2008 | Tsutsumi | C23C 26/00 427/496 |
| 2010/0083985 A1 * | 4/2010 | Numanami | G03F 1/82 134/10 |
| 2012/0186744 A1 * | 7/2012 | Higashijima | H01L 21/67051 156/345.21 |
| 2013/0078381 A1 * | 3/2013 | Miyagi | H01L 21/67051 427/345 |
| 2013/0224956 A1 * | 8/2013 | Negoro | H01L 21/31111 438/697 |
| 2013/0260570 A1 | 10/2013 | Masuhara et al. | |

FOREIGN PATENT DOCUMENTS

| | | |
|---|---|---|
| JP | 5-74754 A | 3/1993 |
| JP | 06-283413 A | 10/1994 |
| JP | 9-246156 A | 9/1997 |
| JP | 3099053 B2 | 10/2000 |
| JP | 2004-273912 A | 9/2004 |
| JP | 2005-191251 A | 7/2005 |
| JP | 2006-278955 A | 10/2006 |
| JP | 4040063 B2 | 1/2008 |
| JP | 2008-066400 A | 3/2008 |
| JP | 2008-085150 A | 4/2008 |
| JP | 2012-044195 A | 3/2012 |
| KR | 10-0497187 B1 | 3/1999 |
| KR | 10-2011-0012743 A | 2/2011 |

OTHER PUBLICATIONS

Final Office Action U.S. Appl. No. 13/853,004 dated May 1, 2015.
Non-Final Office Action U.S. Appl. No. 13/853,004 dated Oct. 23, 2015.
Notice of Allowance U.S. Appl. No. 13/853,004 dated Oct. 7, 2016.

* cited by examiner

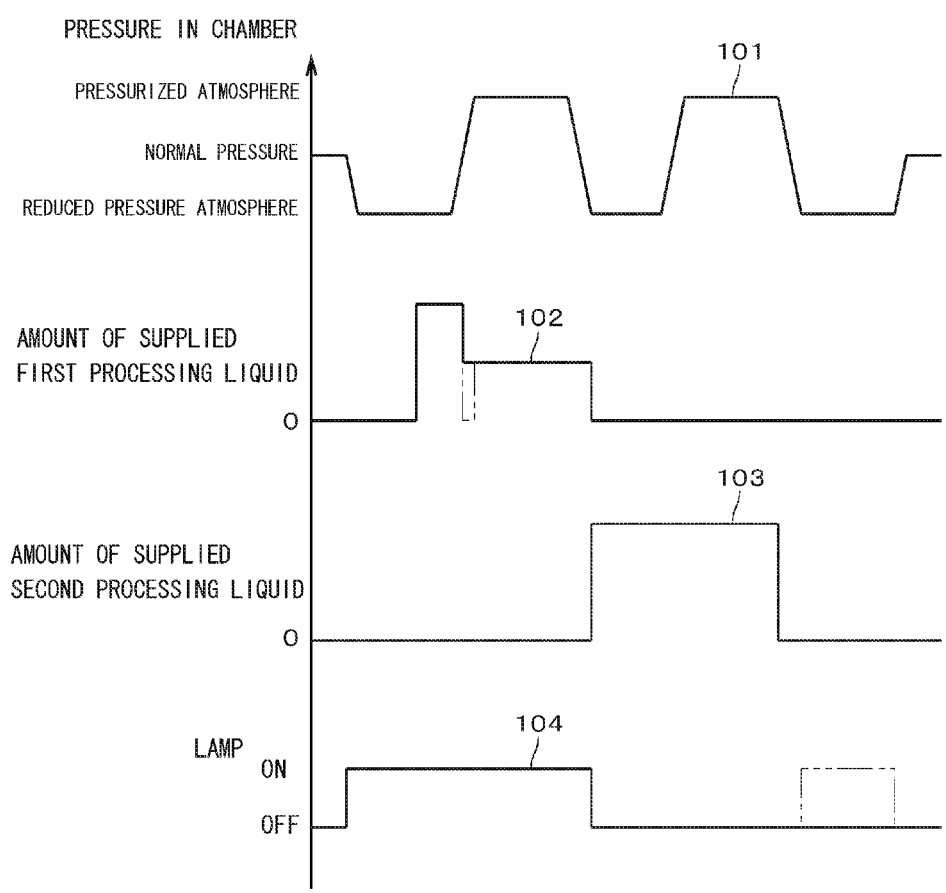

SUBSTRATE PROCESSING APPARATUS AND SUBSTRATE PROCESSING METHOD

CROSS-REFERENCE TO RELATED APPLICATIONS

The subject application is a Divisional application of U.S. Ser. No. 13/853,004 filed Mar. 28, 2013, which claims priority to Japanese Patent Application No. 2012-073600 filed Mar. 28, 2012. The subject matter of each is incorporated herein by reference in entirety.

TECHNICAL FIELD

The present invention relates to a substrate processing apparatus for and a substrate processing method of processing substrates.

BACKGROUND ART

In a process of manufacturing a semiconductor substrate (hereinafter, referred to simply as a "substrate"), conventionally, various processings are performed on a substrate by using a substrate processing apparatus. By supplying a processing liquid onto a substrate having a surface on which a resist pattern is formed, for example, a processing such as etching or the like is performed on the surface of the substrate. Further, after the etching is finished, a process of removing the resist from the substrate and a process of cleaning the substrate are also performed.

Japanese Patent Application Laid-Open No. 2008-85150 (Document 1) relates to a method of cleaning a substrate on which a fine pattern is formed. In a cleaning device shown in Document 1, the inside of a sealed cover in which a substrate is placed is vacuumed to degas the substrate, and the wettability of a surface of the substrate can be thereby improved. Subsequently, a processing liquid is supplied into the sealed cover and the whole of the substrate is immersed in the processing liquid. Then, after bringing the inside of the sealed cover back to normal pressure and removing the sealed cover, rotation of the substrate is started and a cleaning process and the like are performed while the processing liquid is supplied onto the substrate. In the cleaning device, by improving the wettability of the surface of the substrate, a cleaning solution can be brought into good contact with a recessed portion of the fine pattern. Further, in the cleaning device, by increasing pressure in a state where the substrate is immersed in the cleaning solution, the cleaning solution can be infiltrated into the recessed portion of the fine pattern.

Japanese Patent Application Laid-Open No. 2005-191251 (Document 2) discloses an apparatus in which by supplying vapor or the like to a wafer placed in a pressurized chamber in a pressurized atmosphere, moisture is infiltrated into an unnecessary substance on an upper surface of a wafer, and then the unnecessary substance on the upper surface is removed by supplying hot water or the like under normal pressure or in a reduced pressure atmosphere. Further, in a semiconductor wafer developing device disclosed in Japanese Patent Application Laid-Open No. 6-283413 (Document 3), after bringing a processing chamber in which a semiconductor wafer is contained into a reduced pressure atmosphere, by opening a developer supply valve, the processing chamber is filled with the developer. Then, the semiconductor wafer is immersed in the developer and the semiconductor wafer is thereby developed.

In a film formation device disclosed in Patent Publication No. 3099053 (Document 4), a process gas supply part is provided above a wafer in a chamber and an infrared lamp is provided below the wafer. Then, after bringing the inside of the chamber into a vacuum atmosphere, by supplying a process gas while heating the wafer, a thin film is formed on a surface of the wafer. Further, in an apparatus disclosed in Japanese Patent Application Laid-Open No. 9-246156 (Document 5), after rinsing a developer or the like on a wafer by using a rinse liquid, the wafer is dried while being rotated at high speed in a reduced pressure atmosphere.

On the other hand, a semiconductor manufacturing apparatus disclosed in Japanese Patent Application Laid-Open No. 3-22428 (Document 6) uniformizes the amount of processing liquid to be dropped between a center portion of a substrate and a peripheral portion thereof by linearly moving a processing liquid discharge nozzle for dropping a processing liquid toward the substrate in a radial direction above the substrate being rotated.

In the cleaning device disclosed in Document 1, the cleaning solution is supplied onto a center portion of the substrate being rotated under normal pressure and the cleaning solution is spread toward a peripheral portion of the substrate by centrifugal force, to thereby clean the substrate. In the cleaning device, some of the cleaning solution is vapored while the cleaning solution is moved from a center portion of the substrate toward the peripheral portion thereof and the temperature of the substrate is lowered by the heat of vaporization. For this reason, the temperature of the substrate is lowered as it goes from the center portion of the substrate toward the peripheral portion thereof, and therefore there is a possibility that the cleaning may become non-uniform as it goes from the center portion of the substrate toward the peripheral portion thereof.

On the other hand, in the manufacturing apparatus disclosed in Document 6, since the processing liquid is discharged while the processing liquid discharge nozzle is moved above the substrate being rotated under normal pressure, there arises no large difference in temperature between the center portion of the substrate and the peripheral portion thereof. If such a structure is applied to an apparatus in which a substrate is processed in a chamber, however, since a mechanism for moving the processing liquid discharge nozzle is needed, the chamber and the entire apparatus are upsized.

SUMMARY OF INVENTION

The present invention is intended for a substrate processing apparatus for processing a substrate, and it is an object of the present invention to improve the uniformity in the temperature of a main surface of a substrate being processed with a processing liquid.

The substrate processing apparatus according to the present invention includes a substrate holding part for holding a substrate with a main surface thereof directed upward, a processing liquid supply part for supplying a processing liquid onto a center portion of the main surface of the substrate, a substrate rotating mechanism for rotating the substrate together with the substrate holding part, a chamber for containing the substrate holding part in an internal space thereof, a pressure changing part for changing pressure in the internal space of the chamber, and a control part for controlling the processing liquid supply part, the substrate rotating mechanism, and the pressure changing part to bring the internal space of the chamber into a pressurized atmosphere and continuously supply the processing liquid onto the center portion of the main surface of the substrate while rotating the substrate in the pressurized atmosphere, to thereby perform a predetermined processing. By the substrate processing apparatus of the present invention, it is possible to improve the uniformity in the temperature of the main surface of the substrate being processed with the processing liquid.

In a preferred embodiment of the present invention, the substrate processing apparatus further includes a heating part for heating the substrate, and in the substrate processing apparatus of the present invention, the control part controls the pressure changing part and the heating part to bring the internal space of the chamber into a reduced pressure atmosphere and heat the substrate in the reduced pressure atmosphere.

Preferably, the heating part emits light toward the substrate, to thereby heat the substrate.

In another preferred embodiment of the present invention, the control part controls the pressure changing part and the substrate rotating mechanism to bring the internal space of the chamber into the reduced pressure atmosphere and rotate the substrate in the reduced pressure atmosphere, to thereby dry the substrate.

The present invention is also intended for a substrate processing method of processing a substrate.

These and other objects, features, aspects and advantages of the present invention will become more apparent from the following detailed description of the present invention when taken in conjunction with the accompanying drawings.

BRIEF DESCRIPTION OF DRAWINGS

FIG. 3 is a timing chart of the substrate processing.

DESCRIPTION OF EMBODIMENTS

Figure 1:
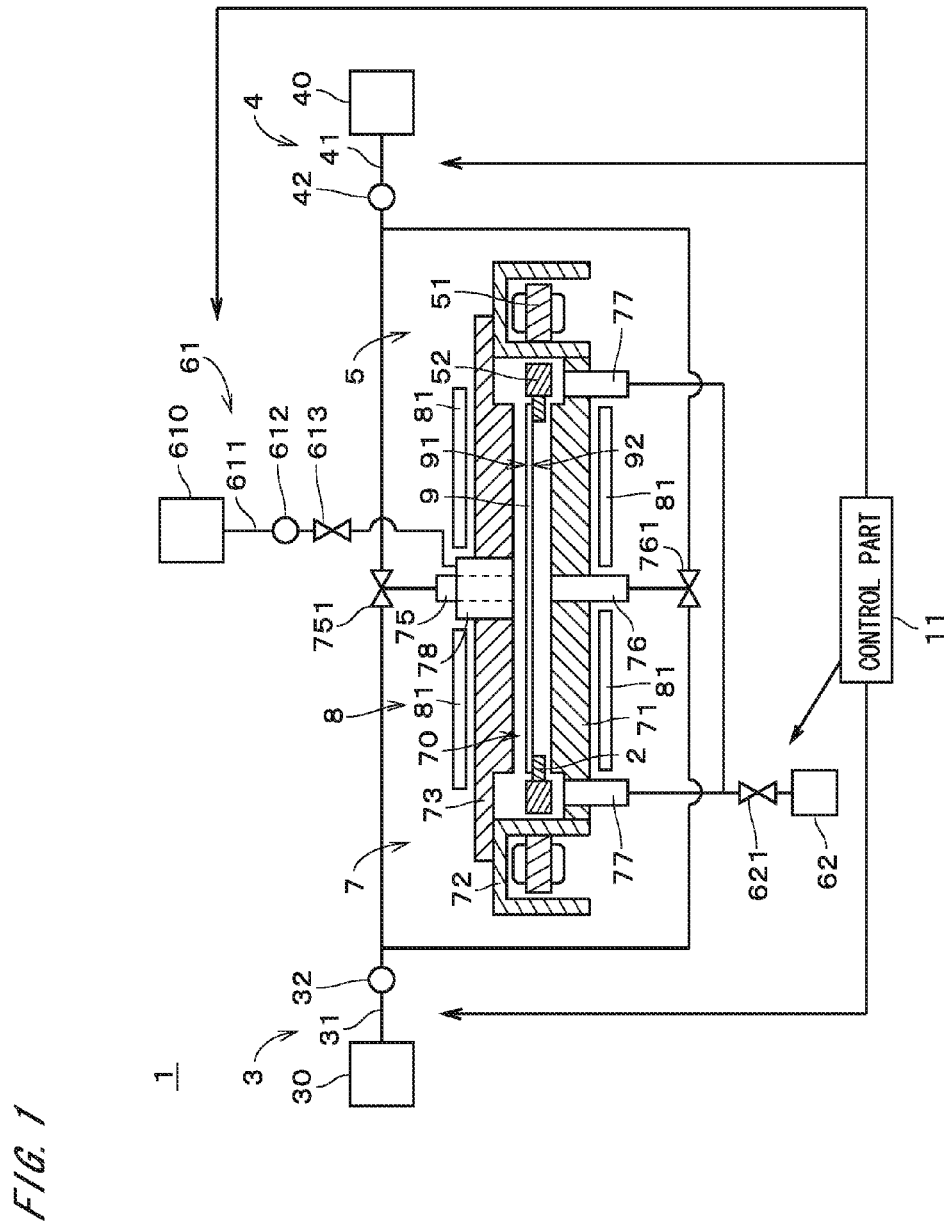
FIG. 1 is a view showing a configuration of a substrate processing apparatus in accordance with a preferred embodiment of the present invention.

FIG. 1 is a view showing a configuration of a substrate processing apparatus 1 in accordance with a preferred embodiment of the present invention. The substrate processing apparatus 1 is a single-substrate processing apparatus for supplying a processing liquid to a semiconductor substrate 9 (hereinafter, referred to simply as a "substrate 9") having a substantially disk-like shape to process substrates one by one.

The substrate processing apparatus 1 includes a substrate holding part 2, a first processing liquid supply part 3, a second processing liquid supply part 4, a substrate rotating mechanism 5, a gas supply part 61, a suction part 62, a chamber 7, a heating part 8, and a control part 11. FIG. 1 is a cross section showing the substrate holding part 2, the substrate rotating mechanism 5, and the chamber 7.

The chamber 7 has a substantially disk-like chamber bottom 71, a substantially cylindrical chamber sidewall 72 fixed to a periphery of the chamber bottom 71, a substantially disk-like chamber cover 73 closing an upper opening of the chamber sidewall 72. The chamber cover 73 is vertically movable, and the substrate 9 is loaded/unloaded into/from the chamber 7 with the chamber cover 73 moved upward, being away from the chamber sidewall 72. When the chamber cover 73 is pressed onto an upper portion of the chamber sidewall 72, an internal space 70 of the chamber 7, which is a sealed space, is formed. The chamber bottom 71 and the chamber cover 73 are translucent members formed of quartz or the like.

An upper pipe 75 is provided at a center portion of the chamber cover 73 and an upper pipe 78 having an annular cross section is provided around the upper pipe 75. The first processing liquid supply part 3 and the second processing liquid supply part 4 are connected to the upper pipe 75 through an upper changeover valve 751, and the gas supply part 61 is connected to the upper pipe 78. A lower center pipe 76 is provided at a center portion of the chamber bottom 71. The first processing liquid supply part 3 and the second processing liquid supply part 4 are connected to the lower center pipe 76 through a lower changeover valve 761. A plurality of lower peripheral pipes 77 are provided in a peripheral portion of the chamber bottom 71 at regular pitches in a circumferential direction. The suction part 62 is connected to the plurality of lower peripheral pipes 77 through a valve 621.

The substrate rotating mechanism 5 is a so-called hollow motor and includes a stator 51 disposed inside the chamber sidewall 72 in the circumferential direction and a substantially annular rotor 52 disposed inside the stator 51 in the internal space 70 of the chamber 7. The rotor 52 is supported by a magnetic force exerted between the rotor 52 and the stator 51 without coming into contact with the stator 51 or the chamber sidewall 72 and rotated about a vertical central axis.

The substrate holding part 2 is a substantially annular disk-like member fixed to an inner peripheral surface of the rotor 52 of the substrate rotating mechanism 5 and contained in the internal space 70 of the chamber 7 together with the rotor 52. The substrate 9 is placed on the substrate holding part 2 with a main surface 91 (hereinafter, referred to as an "upper surface 91") thereof on which a fine pattern is formed directed upward, to be thereby held by the substrate holding part 2. In other words, the substrate holding part 2 comes into contact with a lower surface 92 of the substrate 9, to thereby hold the substrate 9. The substrate holding part 2 may be formed of, for example, a plurality of convex portions protruding from the inner peripheral surface of the rotor 52 inward in the radial direction. In the substrate processing apparatus 1, the control part 11 controls the substrate rotating mechanism 5 to rotate the substrate 9 together with the substrate holding part 2 and the rotor 52 in a horizontal position about the central axis passing through the center of the substrate 9 and being perpendicular to the upper surface 91 of the substrate 9.

The first processing liquid supply part 3 includes a first processing liquid pipe 31 for connecting a first pooling part 30 for pooling a first processing liquid therein and the upper pipe 75 and a pump 32 provided on the first processing liquid pipe 31. The second processing liquid supply part 4 includes a second processing liquid pipe 41 for connecting a second pooling part 40 for pooling a second processing liquid therein and the upper pipe 75 and a pump 42 provided on the second processing liquid pipe 41. The gas supply part 61 includes a gas pipe 611 for connecting a gas source 610 and the upper pipe 78, and a pump 612 and a valve 613 which are provided on the gas pipe 611. The upper pipe 75, the lower center pipe 76, the upper changeover valve 751, and the lower changeover valve 761 which are described above are shared by the first processing liquid supply part 3 and the second processing liquid supply part 4.

In the substrate processing apparatus 1, the control part 11 controls the pump 32 of the first processing liquid supply part 3, the upper changeover valve 751, and the lower changeover valve 761 to supply the first processing liquid onto a center portion of the upper surface 91 of the substrate 9 from the upper pipe 75 and supply the first processing liquid onto a center portion of the lower surface 92 of the substrate 9 from the lower center pipe 76. Further, the control part 11 controls the pump 42 of the second processing liquid supply part 4, the upper changeover valve 751, and the lower changeover valve 761 to supply the second processing liquid onto the center portion of the upper surface 91 of the substrate 9 from the upper pipe 75 and supply the second processing liquid onto the center portion of the lower surface 92 of the substrate 9 from the lower center pipe 76. In this preferred embodiment, the first processing liquid is an etching solution such as hydrofluoric acid, a tetramethylammonium hydroxide solution, or the like, and the second processing liquid is deionized water (DIW).

In the substrate processing apparatus 1, the control part 11 controls the pump 612 and the valve 613 of the gas supply part 61 to supply gas into the internal space 70 of the chamber 7 from the upper pipe 78. In this preferred embodiment, nitrogen gas ($N_2$) is supplied into the chamber 7 by the gas supply part 61.

The suction part 62 performs suction near an edge of the substrate 9 through the plurality of lower peripheral pipes 77. This suction causes the gas in the internal space 70 of the chamber 7 to be discharged to the outside of the chamber 7. In the substrate processing apparatus 1, the control part 11 controls the gas supply part 61 and the suction part 62 to change the pressure in the internal space 70 of the chamber 7. Specifically, by supplying gas into the chamber 7 from the gas supply part 61 with the valve 621 between the suction part 62 and the lower peripheral pipe 77 closed, the pressure in the internal space 70 of the chamber 7 increases to be higher than the normal pressure, (atmospheric pressure) and the internal space 70 is brought into a pressurized atmosphere. Further, by discharging the gas from the chamber 7 by the suction part 62 with the valve 613 of the gas supply part 61 closed, the pressure in the internal space 70 decreases to be lower than the normal pressure, and the internal space 70 is brought into a reduced pressure atmosphere. Thus, the gas supply part 61 and the suction part 62 serve as a pressure changing part for changing the pressure in the internal space 70 of the chamber 7.

The suction part 62 performs suction near the edge of the substrate 9 through the plurality of lower peripheral pipes 77, to thereby discharge the processing liquids supplied into the chamber 7 by the first processing liquid supply part 3 and the second processing liquid supply part 4. Thus, the suction part 62 also serves as a processing liquid discharge part.

The heating part 8 includes lamps 81 provided in an upper portion and a lower portion of the chamber 7. The lamp 81 emits light toward the substrate 9 through the chamber cover 73 and the chamber bottom 71, to thereby heat the substrate 9.

Figure 2:
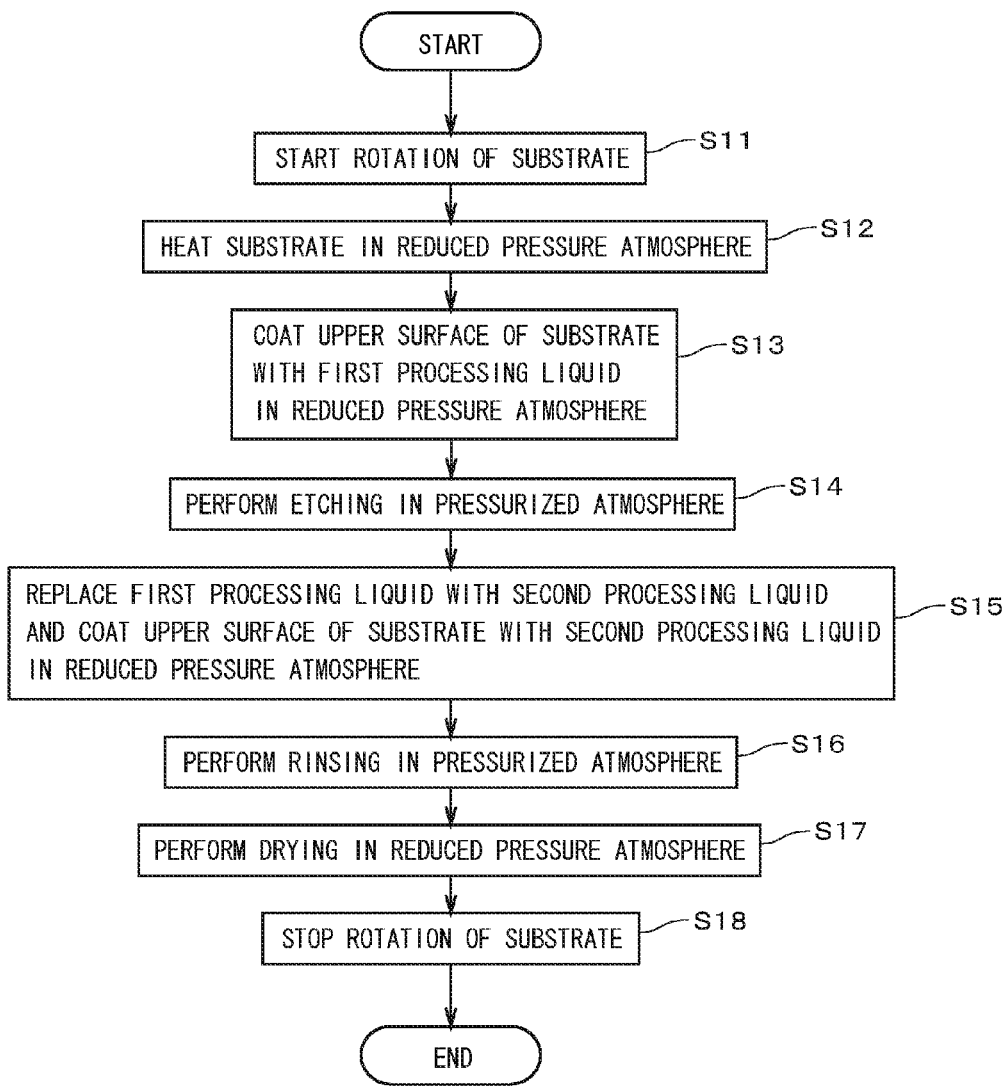
FIG. 2 is a flowchart showing an operation flow of substrate processing.

FIG. 2 is a flowchart showing an operation flow of processing the substrate 9 in the substrate processing apparatus 1. FIG. 3 is a timing chart of processing the substrate 9. In FIG. 3, a line 101 represents the pressure in the chamber 7, a line 102 represents the amount of first processing liquid supplied from the first processing liquid supply part 3, a line 103 represents the amount of second processing liquid supplied from the second processing liquid supply part 4, and a line 104 represents ON/OFF of the lamp 81 of the heating part 8.

In the substrate processing apparatus 1, first, the substrate 9 is loaded into the chamber 7 and held by the substrate holding part 2, and the chamber cover 73 closes the upper opening of the chamber sidewall 72, to thereby hermetically seal the chamber 7. After the chamber 7 is hermetically sealed, the control part 11 controls the substrate rotating mechanism 5 to start rotation of the substrate 9 (Step S11).

Subsequently, the control part 11 controls the heating part 8 and the suction part 62 to light the lamp 81 and discharge the gas from the chamber 7. Then, with the internal space 70 of the chamber 7 brought into the reduced pressure atmosphere, the heating part 8 heats the substrate 9 for a predetermined time period (Step S12). The pressure in the internal space 70 of the chamber 7 which is in the reduced pressure atmosphere should be preferably set lower than the normal pressure, and not lower than about 15 kPa.

Next, the control part 11 controls the first processing liquid supply part 3 to continuously supply the first processing liquid from the upper pipe 75 onto the upper surface 91 of the substrate 9 being rotated in the chamber 7 in the reduced pressure atmosphere. The first processing liquid supplied onto the center portion of the upper surface 91 of the substrate 9 is spread toward the peripheral portion by the rotation of the substrate 9, and the entire upper surface 91 is thereby coated with the first processing liquid (Step S13). The first processing liquid overflown from the upper surface 91 of the substrate 9 is sucked by the suction part 62 which is controlled by the control part 11, to be thereby discharged to the outside of the chamber 7. Further, the first processing liquid is also supplied from the lower center pipe 76 onto the center portion of the lower surface 92 of the substrate 9 and spread toward the peripheral portion by the rotation of the substrate 9.

After the upper surface 91 of the substrate 9 is coated with the first processing liquid, the control part 11 controls the gas supply part 61 to increase the pressure in the internal space 70 of the chamber 7 to a predetermined pressure higher than the normal pressure, (preferably higher than the normal pressure, and not higher than a pressure higher than the normal pressure by about 0.1 MPa). Further, the control part 11 controls the first processing liquid supply part 3 and the substrate rotating mechanism 5 to reduce the amount of first processing liquid (hereinafter, referred to as "flow rate") supplied from the first processing liquid supply part 3 per unit time and reduce the number of revolution (i.e. decrease the rotating speed) of the substrate 9. As indicated by the two-dot chain line in FIG. 3, while the pressure in the internal space 70 increases, the supply of the first processing liquid may be stopped. When the internal space 70 of the chamber 7 is brought into a predetermined pressurized atmosphere, the first processing liquid which is an etching solution is continuously supplied at a flow rate lower than that in Step S13 onto the upper surface 91 of the substrate 9 being rotated at a number of revolution less than that in Step S13 (i.e. at a rotating speed lower than that in Step S13) and an etching process is thereby performed for a predetermined time period (Step S14).

Subsequently, the control part 11 controls the suction part 62 to reduce the pressure in the internal space 70 of the chamber 7 to a predetermined pressure lower than the normal pressure (preferably lower than the normal pressure, and not lower than about 15 kPa). Then, the supply of the first processing liquid from the first processing liquid supply part 3 is stopped, and the lamp 81 is extinguished and the heating part 8 stops heating the substrate 9.

Next, the control part 11 controls the second processing liquid supply part 4 to continuously supply the second processing liquid from the upper pipe 75 onto the upper surface 91 of the substrate 9 being rotated in the chamber 7 in the reduced pressure atmosphere. The second processing liquid supplied onto the center portion of the upper surface 91 of the substrate 9 which is coated with the first processing liquid is spread toward the peripheral portion by the rotation of the substrate 9, and the first processing liquid on the upper surface 91 is pushed away from the edge of the substrate 9 to the outside thereof. Then, the first processing liquid on the upper surface 91 of the substrate 9 is replaced with the second processing liquid and the entire upper surface 91 is thereby coated with the second processing liquid (Step S15). The first processing liquid and the second processing liquid overflown from the upper surface 91 of the substrate 9 are sucked by the suction part 62, to be thereby discharged to the outside of the chamber 7. Further, the second processing liquid is also supplied from the lower center pipe 76 onto the center portion of the lower surface 92 of the substrate 9 and spread toward the peripheral portion by the rotation of the substrate 9.

After the coating of the upper surface 91 of the substrate 9 with the second processing liquid is finished, the control part 11 controls the gas supply part 61 to increase the pressure in the internal space 70 of the chamber 7 to a predetermined pressure higher than the normal pressure (preferably higher than the normal pressure, and not higher than a pressure higher than the normal pressure by about 0.1 MPa). While the pressure in the internal space 70 increases and also after the internal space 70 is brought into a predetermined pressurized atmosphere, the supply of the second processing liquid from the second processing liquid supply part 4 continues. Then, the second processing liquid which is deionized water is continuously supplied onto the upper surface 91 of the substrate 9 being rotated in the internal space 70 in the pressurized atmosphere and a rinse process is performed for a predetermined time period (Step S16).

After the rinse process is finished, the supply of the second processing liquid from the second processing liquid supply part 4 is stopped, and the control part 11 controls the suction part 62 to reduce the pressure in the chamber 70 of the chamber 7 to a predetermined pressure lower than the normal pressure (preferably lower than the normal pressure, and not lower than about 15 kPa). Then, with the internal space 70 brought into a predetermined reduced pressure atmosphere, the control part 11 controls the substrate rotating mechanism 5 to increase the number of revolution of the substrate 9, and with high-speed rotation of the substrate 9, the second processing liquid is removed from the substrate 9 and a process of drying the substrate 9 is thereby performed (Step S17). While the drying process is performed on the substrate 9 under reduced pressure, the second processing liquid removed from the substrate 9 is sucked by the suction part 62 and discharged to the outside of the chamber 7. As indicated by the two-dot chain line in FIG. 3, while the drying process is performed on the substrate 9 under reduced pressure, the substrate 9 may be heated by the heating part 8 concurrently. This can promote drying of the substrate 9.

After the drying of the substrate 9 is finished, the rotation of the substrate 9 is stopped (Step S18), and the internal space 70 of the chamber 7 is bought back to normal pressure. After that, the chamber cover 73 is separated from the chamber sidewall 72, and the substrate 9 is unloaded from the chamber 7.

As discussed above, in the substrate processing apparatus 1, the substrate 9 is heated by the heating part 8 with the internal space 70 of the chamber 7 brought into the reduced pressure atmosphere in Step S12. This suppresses the movement of the heat from the substrate 9 to the ambient gas and the substrate 9 can be heated in a shorter time as compared with under normal pressure. Further, since the heating part 8 includes the lamp 81 for heating the substrate 9 by emitting light toward the substrate 9, it is possible to simplify the configuration of the chamber 7 and the inside of the chamber 7.

In Step S13, with the internal space 70 of the chamber 7 brought into the reduced pressure atmosphere, the first processing liquid is supplied onto the upper surface 91 of the substrate 9 while the substrate 9 is rotated, and therefore the first processing liquid can be quickly spread from the center portion to the peripheral portion on the upper surface 91 of the substrate 9. The upper surface 91 of the substrate 9 can be thereby coated with the first processing liquid in a shorter time as compared with under normal pressure. Further, since the suction part 62 sucks the first processing liquid from the vicinity of the edge of the substrate 9, the movement speed of the first processing liquid on the upper surface 91 of the substrate 9 can be increased. As a result, the coating of the upper surface 91 of the substrate 9 with the first processing liquid can be performed in a still shorter time, and the time required for the processing of the substrate 9 can be shortened.

In Step S13, as discussed above, since the amount of gas existing in a gap between fine patterns (hereinafter, referred to as a "pattern gap") on the substrate 9 decreases as compared with under normal pressure by bringing the internal space 70 of the chamber 7 into the reduced pressure atmosphere, the first processing liquid supplied on the upper surface 91 of the substrate 9 can easily enter the pattern gap. It is thereby possible to appropriately perform an etching process in the pattern gap. Further, after the upper surface 91 of the substrate 9 is coated with the first processing liquid, by increasing the pressure in the internal space 70 of the chamber 7, the first processing liquid is squeezed into the pattern gap. As a result, it is possible to cause the first processing liquid to more easily enter the pattern gap. Further, since the pressure in the internal space 70 of the chamber 7 is increased to a pressure higher than the normal pressure and the internal space 70 is thereby brought into the pressurized atmosphere, it is possible to cause the first processing liquid to much more easily enter the pattern gap.

In Step S14, with the internal space 70 of the chamber 7 brought into the pressurized atmosphere, the first processing liquid is continuously supplied onto the upper surface 91 of the substrate 9 while the substrate 9 is rotated, and the etching process is thereby performed. This suppresses vaporization of the first processing liquid on the substrate 9 as compared with under normal pressure, and further suppresses a decrease in the temperature of the substrate 9 due to the heat of vaporization as it goes from the center portion of the substrate 9 toward the peripheral portion thereof. As a result, it is possible to improve the uniformity in the temperature of the upper surface 91 of the substrate 9 being subjected to the etching process using the first processing liquid and improve the uniformity of etching over the entire upper surface 91 of the substrate 9. Further, the uniformity of etching over the entire lower surface 92 of the substrate 9 can be also improved.

As discussed above, the number of revolution of the substrate 9 in the etching process performed on the substrate 9 in Step S14 is smaller than that of the substrate 9 in the process of coating the upper surface 91 of the substrate 9 with the first processing liquid in Step S13. This further suppresses vaporization of the first processing liquid from the substrate 9 and it is thereby possible to further improve the uniformity in the temperature of the upper surface 91 of the substrate 9 being subjected to the etching process. As a result, it is possible to further improve the uniformity of etching over the entire upper surface 91 of the substrate 9.

In Step S15, with the internal space 70 of the chamber 7 brought into the reduced pressure atmosphere, the second processing liquid is supplied onto the upper surface 91 of the substrate 9 while the substrate 9 is rotated, and therefore the second processing liquid can be quickly spread from the center portion to the peripheral portion on the upper surface 91 of the substrate 9. The replacement of first processing liquid with the second processing liquid and the coating of the upper surface 91 of the substrate 9 with the second processing liquid can be performed in a shorter time as compared with under normal pressure. Further, since the suction part 62 sucks the first processing liquid and the second processing liquid from the vicinity of the edge of the substrate 9, the replacement of the first processing liquid with the second processing liquid and the coating of the upper surface 91 of the substrate 9 with the second processing liquid can be performed in a still shorter time.

In the substrate processing apparatus 1, as discussed above, after the upper surface 91 of the substrate 9 is coated with the second processing liquid, by increasing the pressure in the internal space 70 of the chamber 7, the second processing liquid is squeezed into the pattern gap. As a result, the second processing liquid can easily enter the pattern gap and it is therefore possible to more reliably replace the first processing liquid with the second processing liquid. Further, since the pressure in the internal space 70 of the chamber 7 is increased to a pressure higher than the normal pressure and the internal space 70 is brought into the pressurized atmosphere, it is possible to cause the second processing liquid to much more easily enter the pattern gap.

In Step S16, with the internal space 70 of the chamber 7 brought into the pressurized atmosphere, the second processing liquid is continuously supplied onto the upper surface 91 of the substrate 9 while the substrate 9 is rotated, and the rinse process is thereby performed. This suppresses vaporization of the second processing liquid on the substrate 9 as compared with under normal pressure, and further suppresses a decrease in the temperature of the substrate 9 due to the heat of vaporization as it goes from the center portion of the substrate 9 toward the peripheral portion thereof. As a result, it is possible to improve the uniformity in the temperature of the upper surface 91 of the substrate 9 being subjected to the rinse process using the second processing liquid. Further, it is also possible to improve the uniformity of rinsing over the entire lower surface 92 of the substrate 9.

In Step S17, with the internal space 70 of the chamber 7 brought into the reduced pressure atmosphere, the drying process is performed on the substrate 9 while the substrate 9 is rotated. It is thereby possible to perform the drying of the substrate 9 in a shorter time as compared with under normal pressure.

This preferred embodiment allows various variations.

For example, after the rinse process (Step S16) is finished, isopropyl alcohol (IPA) is supplied onto the upper surface 91 and the lower surface 92 of the substrate 9, and the drying process (Step S17) may be performed after replacing the second processing liquid on the substrate 9 with the IPA. In the case where the IPA replacement is performed, it is preferable that the IPA should be supplied onto the substrate 9 with the internal space 70 of the chamber 7 brought into the reduced pressure atmosphere. With this pressure reduction, like the replacement of the first processing liquid with the second processing liquid (Step S15), the replacement of the second processing liquid with the IPA and the coating of the upper surface 91 of the substrate 9 with the IPA can be performed in a shorter time as compared with under normal pressure. Further, since the suction part 62 sucks the second processing liquid and the IPA from the vicinity of the edge of the substrate 9, the replacement of the second processing liquid with the IPA and the coating of the upper surface 91 of the substrate 9 with the IPA can be performed in a still shorter time.

The first processing liquid and the second processing liquid are not necessarily limited to an etching solution and deionized water, respectively, but various other processing liquids may be used as the first processing liquid and the second processing liquid to perform various processings on the substrate 9. The supply of the first processing liquid and the second processing liquid onto the lower surface 92 may be omitted. Further, in the substrate processing apparatus 1, the second processing liquid supply part 4 may be omitted and only the processing of the substrate 9, using the first processing liquid, may be performed.

The heating part 8 is not limited to one which emits light toward the substrate 9 to heat the substrate 9. For example, a heater such as an electrically heated wire or the like may be provided as the heating part 8 inside the chamber bottom 71 and the chamber cover 73. Further, instead of the suction part 62, a gas suction part for sucking gas in the chamber 7 and a processing liquid suction part for sucking the processing liquid in the chamber 7 may be provided separately.

In the substrate processing apparatus 1, the processing may be performed on various kinds of substrates other than the semiconductor substrate. The configuration of the chamber 7 may be changed as appropriate in accordance with the shape of a substrate to be processed.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
2 Substrate holding part
3 First processing liquid supply part
4 Second processing liquid supply part
5 Substrate rotating mechanism
7 Chamber
8 Heating part
9 Substrate
11 Control part
61 Gas supply part
62 Suction part
70 Internal space
91 Upper surface (of Substrate)
S11 to S18 Step

The invention claimed is:

1. A substrate processing method of processing a substrate, comprising the steps of:
   a) holding a substrate with a main surface thereof directed upward in an internal space of a chamber;
   b) continuously supplying a processing liquid onto a center portion of said main surface of said substrate while rotating said substrate at a first rotational speed, to thereby coat said main surface of said substrate with said processing liquid, and c) bringing said internal space of said chamber into a pressurized atmosphere at which vaporization of said processing liquid can be suppressed and continuously supplying a processing liquid onto said center portion of said main surface of said substrate while rotating said substrate at a second rotational speed lower than said first rotational speed in said pressurized atmosphere, to thereby perform a predetermined processing.

2. The substrate processing method according to claim 1, further comprising the step of:

d) bringing said internal space of said chamber into a reduced pressure atmosphere and heating said substrate in said reduced pressure atmosphere before said step c).

3. The substrate processing method according to claim 2, wherein said substrate is heated by emitting light toward said substrate in said step d).

4. The substrate processing method according to claim 3, further comprising the step of:

e) bringing said internal space of said chamber into a reduced pressure atmosphere and drying said substrate while rotating said substrate in said reduced pressure atmosphere after said step c).

5. The substrate processing method according to claim 2, further comprising the step of:

e) bringing said internal space of said chamber into a reduced pressure atmosphere and drying said substrate while rotating said substrate in said reduced pressure atmosphere after said step c).

6. The substrate processing method according to claim 1, further comprising the step of:

e) bringing said internal space of said chamber into a reduced pressure atmosphere and drying said substrate while rotating said substrate in said reduced pressure atmosphere after said step b).

\* \* \* \* \*